United States Patent [19]

Pazaris et al.

[11] Patent Number: 5,646,581
[45] Date of Patent: Jul. 8, 1997

[54] LOW INDUCTANCE ELECTRICAL RESISTOR TERMINATOR PACKAGE

[75] Inventors: James O. Pazaris, Concord; Richard P. Evans, Bolton, both of Mass.

[73] Assignee: Digital Equipment Corporation, Maynard, Mass.

[21] Appl. No.: 599,512

[22] Filed: Jan. 26, 1996

Related U.S. Application Data

[63] Continuation of Ser. No. 265,294, Jun. 24, 1994, abandoned.
[51] Int. Cl.⁶ ...................................................... H03H 5/00
[52] U.S. Cl. .......................... 333/22 R; 338/61; 338/295
[58] Field of Search ........................ 333/22 R; 338/260, 338/295, 48, 61

[56] References Cited

U.S. PATENT DOCUMENTS 4,626,804  12/1986  Risher et al. ........................ 333/22 R

FOREIGN PATENT DOCUMENTS 311004  11/1992  Japan ..................................... 338/260

OTHER PUBLICATIONS

Dale Electronics Single–In–Line, Molded Thick Film Resistor Networks —Date: 1991.

*Primary Examiner*—Paul Gensler
*Attorney, Agent, or Firm*—Joanne N. Pappas; Denis G. Maloney; Arthur W. Fisher

[57] ABSTRACT

A termination device including a package having a first plurality of pins and a plurality of resistors disposed in the package is described. Each resistor has a pair of termini with one of the termini of each resistor connected to a corresponding one of the first plurality of pins and the other termini connected to a common conductor. The device also includes a reference conductor connected to a mid-portion of the common conductor and to a pin of the package. An alternate embodiment of the termination device includes two reference conductors connected to respective end portions of the common conductor and to pins of the package.

7 Claims, 5 Drawing Sheets

REFERENCE VOLTAGE

LOW INDUCTANCE ELECTRICAL RESISTOR TERMINATOR PACKAGE

Application Ser. No. 08/599,512 is a continuation of parent application Ser. No. 08/265,294, filed Jun. 24, 1994, now abandoned.

BACKGROUND OF THE INVENTION

This invention relates generally to electrical terminations, and more particularly to termination networks used to terminate electric signal lines.

As it is known in the art, terminations are commonly used to absorb energy of electrical signals at the end of transmission lines to prevent this energy from being reflected back into other circuitry. In digital applications, unlike microwave applications, an ideal termination is a resistor having no significant inductive or capacitive components. One known layout provides termination resistors in an integrated circuit package with six to eight resistors each having one lead sharing a single common return conductor coupled to one pin of the package, which is used to provide the terminator reference voltage and with the other lead of each resistor coupled to corresponding pins of the package. Multiple terminating resistors are available from many vendors in single-inline packages (SIPs). These packages are compact, inexpensive, and offer an efficient way to terminate many signals in a small area, as from a common bus, for example.

A basic problem encountered in the physical design of the SIPs electrical termination schemes, is that, generally for high frequency signal termination with multiple resistors in a package, there is a relatively high intrinsic inductance from the power or reference pin to the individual resistors. Signals on the transmission lines that are being terminated place current through the resistors, and through the common inductance of the return lead. A voltage is generated across the intrinsic inductance of the lead by the changing signal current, according to $V=-Ldi/dt$. This induced voltage appears as noise on the signal paths.

Thus, the problem of high inductance is aggravated because there is noise caused by the rapidly changing current through the inductance of the power and reference paths to the resistors.

Further, the inductance is large because the common return path tends to be physically long. This path is also shared by a number of signals, such that the total current through the inductance is increased. Therefore, the noise generated is large, especially when the signal rise-times are fast and the frequencies are high.

In the prior art, this high inductance was not a obstacle with lower speed signals (ie. in the 5–10 nanosecond rise-time range). However, today, signal rise times have increased (ie. in the one nanosecond rise-time range and less), primarily due to the development of faster components.

One common solution to the intrinsically high inductance associated with high frequency signal termination with multiple resistors in a package to some degree is to use discrete chip surface mount resistors and resistor networks with integral bypass capacitors to compensate for the inductance. However, a problem with this solution arises because the chip resistors are all discrete parts and their use requires more parts placements on the boards taking up more "real estate" and potentially lowering yields.

Another solution for decreasing inductance is to mount a small capacitor on the resistors in the multiple resistor package. The capacitors serve to compensate for the loop inductance by providing current for the resistors locally, thus bypassing the inductive path for short term current frequencies. However, this method is more expensive than a regular resistor package (SIP) without integral capacitors and requires a multi-pass assembly process which is prone to some error. Further, the capacitance may not be the correct value for all frequency ranges of signals. The capacitors also introduce resonances into the terminator's characteristics which could cause unwanted signal distortion.

SUMMARY OF THE INVENTION

In accordance with the present invention a termination device includes a package having a plurality of pins, a plurality of resistors disposed in said package each having a pair of termini with one of said termini of each resistor connected to a corresponding one of said first plurality of pins. The termination device further includes a common conductor connected to a second one of said termini of each resistor, and a reference conductor having a first terminus at a mid-portion of said common conductor and a second terminus at one of said plurality of pins. The termination device further includes a pair of reference conductors, each having a first terminus at one of respective end portions of said common conductor and a second terminus at one of said plurality of pins.

The termination device further includes said plurality of resistors configured in a pull-up/pull-down resistor network. With such an arrangement, the termination device provides a lower inductance in the common lead of multiple resistor packages by multiple paths for power and power return leads to the resistors used for terminating transmission lines. By furnishing multiple paths, lower effective inductances are provided. Hence, the noise voltages generated by the changing current passing through an inductor are significantly decreased. This allows the packaged termination resistors to be used at higher frequencies and/or higher current switching values without having the noise increase significantly,

BRIEF DESCRIPTION OF THE DRAWINGS

The above-mentioned and other features of the invention will become more apparent by reference to the following description taken in connection with the accompanying drawings in which.

DESCRIPTION OF THE PREFERRED EMBODIMENT

Figure 1A:
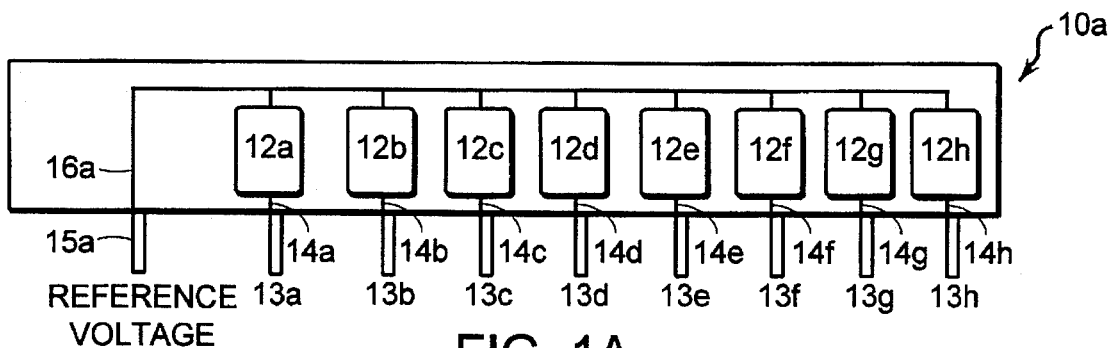
FIG. 1A is a schematic diagram of the prior art standard single terminating resistor network.

Referring now to FIG. 1A, a resistor terminator package $10a$, of the prior art, is shown to include eight thick film terminating resistors ($12a$–$12h$) which are used to terminate eight conductors ($14a$–$14h$) of the transmission line. All the resistors ($12a$–$12h$) have one terminus connected to a common lead or reference line $16a$ which is connected to a pin $15a$ of the package $10a$ and which is used to provide the terminator reference voltage. The other ends of resistors $12a$–$12h$ are coupled to pins $13a$–$13h$ via conductors $14a$–$14h$. The purpose of resistors $12a$–$12h$ is to absorb the energy of electrical conductors $14a$–$14h$ at the end of the transmission lines, and to prevent this energy from being reflected back into other circuitry. For the digital type of package, an ideal terminating resistor network would only have resistance.

As will now be described below, are three embodiments of a resistor terminator package having arrangements to lower or reduce the effective intrinsic inductance of a reference signal path interconnecting a common connection of resistor elements in a resistor termination package to a reference or supply voltage.

Figure 1B:
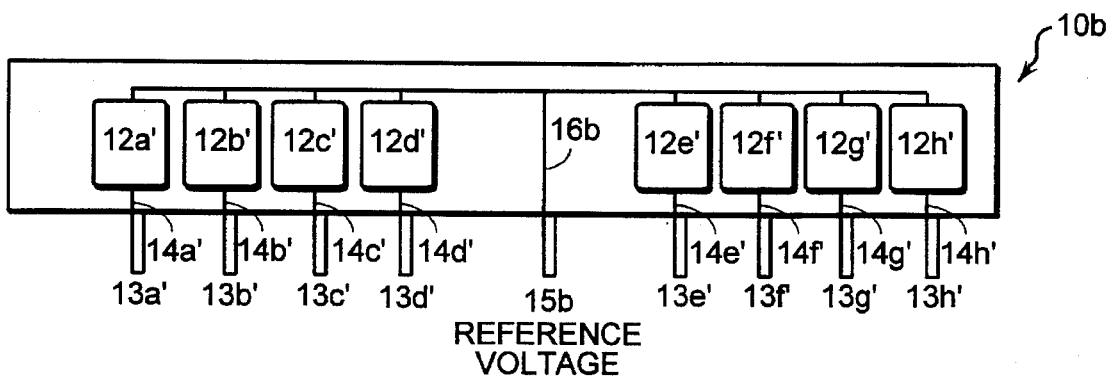
FIG. 1B is a schematic diagram of the present invention preferred center terminating resistor network.

Referring now to FIG. 1B, a schematic diagram of an electrical resistor terminator package $10b$ having a center connected reference conductor in accordance with the present invention, is shown to include eight thick film terminating resistors ($12a'$–$12h'$) which can be used to terminate eight conductors ($14a'$–$14h'$). All the resistors ($12a'$–$12h'$) have one terminus connected to a common lead or reference line $16b$ which is connected to a pin $15b$ of the package $10b$ and which is used to provide the terminator reference voltage. The other termini of resistors $12a'$–$12h'$ are coupled to pins $13a'$–$13h'$ via conductors $14a'$–$14h'$. Reference line $16b$ is located at the center of the SIP, rather than at the end of the SIP as in FIG. 1A. This reassignment of signal and reference positions does not add any additional pins to the SIP package (ie. FIG. 1A and 1B utilize the same number of pins which in this example is 9). Changing signal currents cause noise across inductances, therefore, by moving the reference voltage pin to the center position, there is an increase in the number of paths and there is a reduced length to the reference voltage pin, which subsequently reduces the inductance of this package in comparison to prior art FIG. 1A, as will also be described in conjunction with FIG. 5A.

Figure 1C:
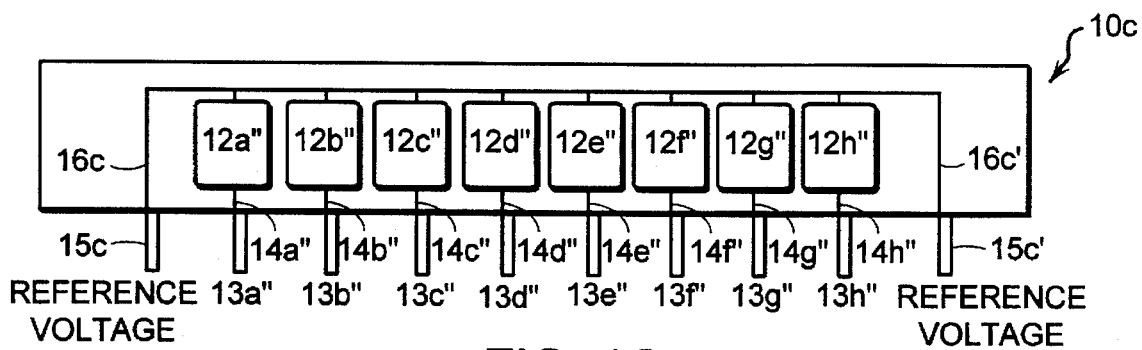
FIG. 1C is a schematic diagram of the present invention preferred double terminating resistor network.

Referring now to FIG. 1C, an alternate electrical resistor terminator package $10c$ having two reference conductor connections, is shown to include eight thick film terminating resistors ($12a''$–$12h''$) which are used to terminate eight conductors ($14a''$–$14h''$) of the transmission line. All the resistors ($12a''$–$12h''$) have one terminus connected to common lead or reference lines $16c$ and $16c'$ which are connected to a pin $15c$ and pin $15c'$, respectively, of the package $10c$ and which are used to provide the terminator reference voltage. The other termini of resistors $12a''$–$12h''$ are coupled to pins $13a''$–$13h''$ via conductors $14a''$–$14h''$. These leads $16c$ and $16c'$ and thus, pins $15c$ and $15c'$, are located at the two ends of the SIP package. This double reference connection resistor terminator package $10c$ adds an additional pin to the typical SIP package, providing a SIP package with 10 pins.

Figure 1D:
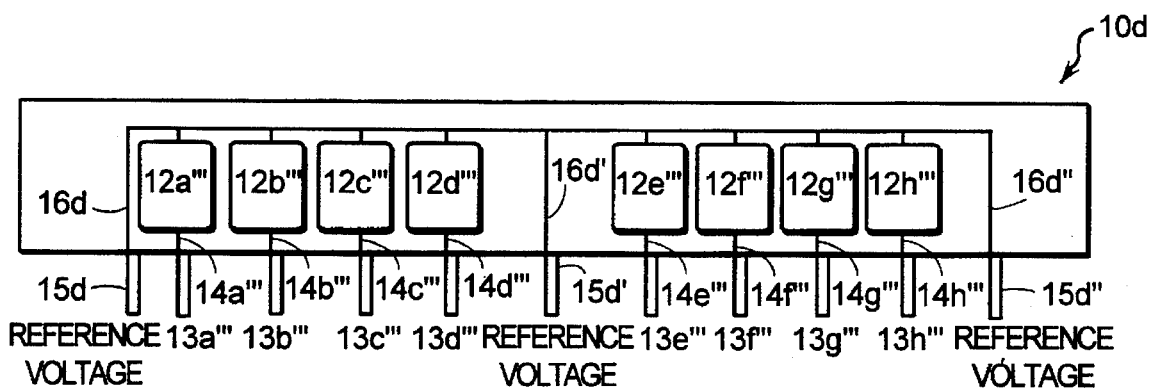
FIG. 1D is a schematic diagram of the present invention preferred triple terminating resistor network.

Referring now to FIG. 1D, a diagram of an electrical resistor terminator package $10d$ having three reference conductor connections, is shown to include eight thick film terminating resistors ($12a'''$–$12h'''$) which are used to terminate eight conductors ($14a'''$–$14h'''$) of the transmission line. All the resistors ($12a'''$–$12h'''$) have one terminus connected to common leads or reference lines, $16d$, $16d'$ and $16d''$, which are connected to pins $15d$, $15d'$ and $15d''$, respectively, and which are used to provide the terminator reference voltage. The other termini of resistors $12a'''$–$12h'''$ are coupled to pins $13a'''$–$13h'''$ via conductors $14a'''$–$14h'''$. The pins $15d$, $15d'$, and $15d''$ are located at the two ends of the SIP package and at the center, respectively, of the SIP package, providing almost a hybrid of FIG. 1B and 1C. This triple reference connection resistor terminator package $10d$ adds two additional pin to the regular SIP package, providing a SIP package with 11 pins.

Figure 2A:
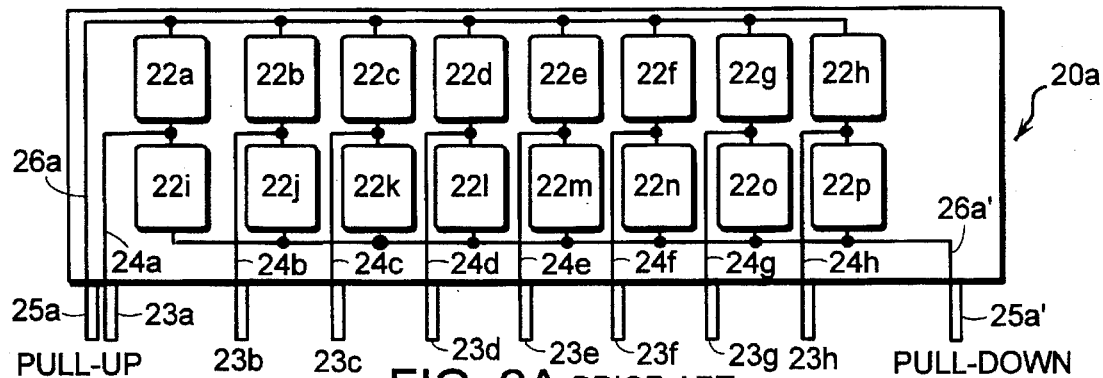
FIG. 2A is a schematic diagram of the prior art standard pull-up/pull-down terminating resistor network.

Referring now to FIG. 2A, a pull-up/pull-down network resistor termination package $20a$ of the prior art, is shown to include sixteen thick film terminating resistors ($22a$–$22p$) used to terminate eight conductors ($24a$–$24h$) of the transmission line. All the resistors ($22a$–$22p$) have one terminus coupled to pins $23a$–$23h$ via conductors $24a$–$24h$. The upper resistors $22a$–$22h$ have their other terminus connected to a common lead or reference line $26a$ which is connected to a pin $25a$ of the package $20a$ and which is used to provide the terminator reference pull-up voltage. The lower resistors $22i$–$22p$ have their other termini connected to a common lead $26a'$ which is connected to pin $25a'$ of the package $20a$ and which is used to provide the terminator reference pull-down voltage. For the digital type of package, an ideal terminating resistor network would only have resistance.

As will now be discussed below, three embodiments of a pull-up/pull-down resistor terminator package having arrangements to lower or reduce the effective intrinsic inductance of a signal path interconnecting a common connection of resistive elements in a resistor termination package to a reference or supply voltage.

Figure 2B:
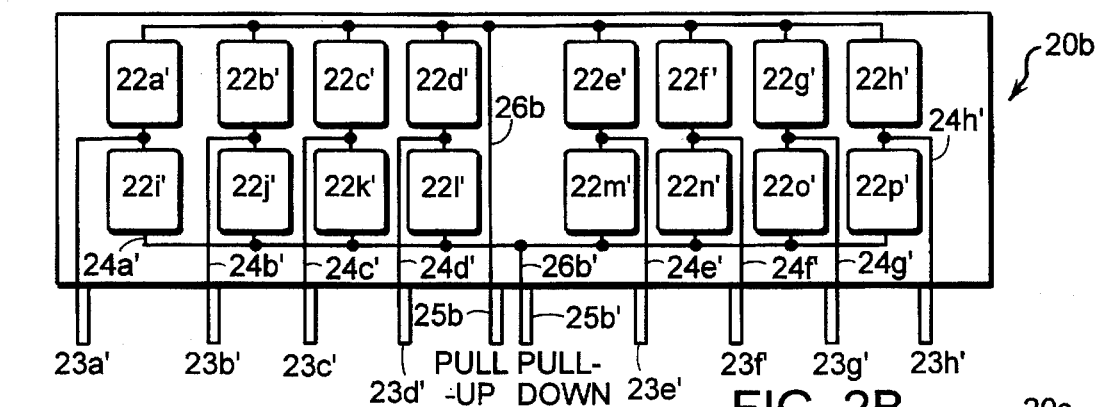
FIG. 2B is a schematic diagram of the present invention center pull-up/pull-down terminating resistor network.

Referring now to FIG. 2B, a pull-up/pull-down network resistor termination package $20b$ having a reference conductor pull-up/pull-down connection in the center of the package, is shown to include sixteen thick film terminating resistors ($22a'$–$22p'$) used to terminate eight signals ($24a'$–$24h'$) of the transmission line. All the resistors ($22a'$–$22p'$) have one terminus coupled to pins $23a'$–$23h'$ via conductors $24a'$–$24h'$. The upper resistors $22a'$–$22h'$ have their other termini connected to a common lead or reference line $26b$ which is located in the center of the package and connected to a pin $25b$ of the package $20b$ and used to provide the terminator reference pull-up voltage. The lower resistors $22i'$–$22p'$ have their other termini connected to a common lead $26b'$ which is connected to pin $25b'$ of the package $20b$ and which is used to provide the terminator reference pull-down voltage. This configuration provides for the pull-up and pull-down pins to be located next to each other to allow for maximum mutual inductive coupling and hence, minimum total inductance since the currents will tend to be going in the opposite direction.

Figure 2C:
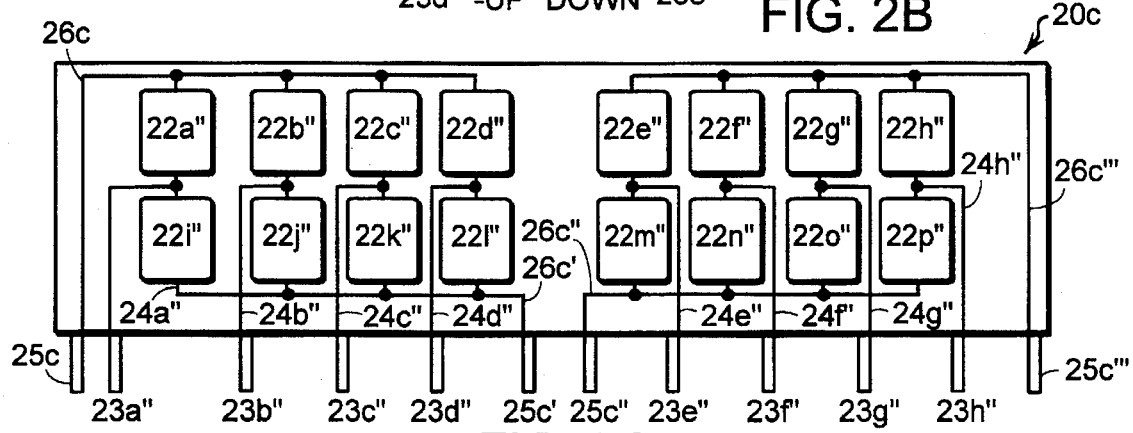
FIG. 2C is a schematic diagram of the present invention double pull-up/pull-down terminating resistor network.

Referring now to FIG. 2C, a pull-up/pull-down network resistor termination package 20c having two reference conductor pull-up/pull-down connections, is shown to include sixteen thick film terminating resistors (22a"–22p") used to terminate eight signals (24a"–24h") of the transmission line. Resistors 22a"–22d" and 22i"–22l" have one terminus coupled to pins 23a"–23d" via conductors 24a"–24d". The upper left resistors 22a"–22d" have their upper termini connected to a common lead or reference line 26c connected to a pin 25c of the package 20c and used to provide the terminator reference pull-up voltage. The lower left resistors 22i"–22l" have their lower termini connected to a common lead 26c' which is connected to pin 25c' of the package 20c and which is used to provide the terminator reference pull-down voltage.

Resistors 22e"–22h" and 22m"–22p" have one terminus coupled to pins 23e"–23h" via signals 24e"–24h". The upper right resistors 22e"–22h" have their upper termini connected to a common lead or reference line 26c" connected to a pin 25c" of the package 20c and used to provide another terminator reference pull-up voltage. The lower right resistors 22m"–22p" have their lower termini connected to a common lead 26c"' which is connected to pin 25c"' of the package 20c and which is used to provide another terminator reference pull-down voltage. This configuration provides for the center pull-up and pull-down pins to be physically located next to each other, essentially in parallel, to allow for maximum mutual inductive coupling and hence, minimum total inductance. There is less switching current (di) for two groups as in FIG. 2C, than there is for all eight together in one group as shown in FIG. 2A., hence, Ldi/dt is a smaller value. Also, the length of the connection is essentially half that of prior art FIG. 2A, thus lowering the inductance portion (L) of Ldi/dt, as well.

Figure 2D:
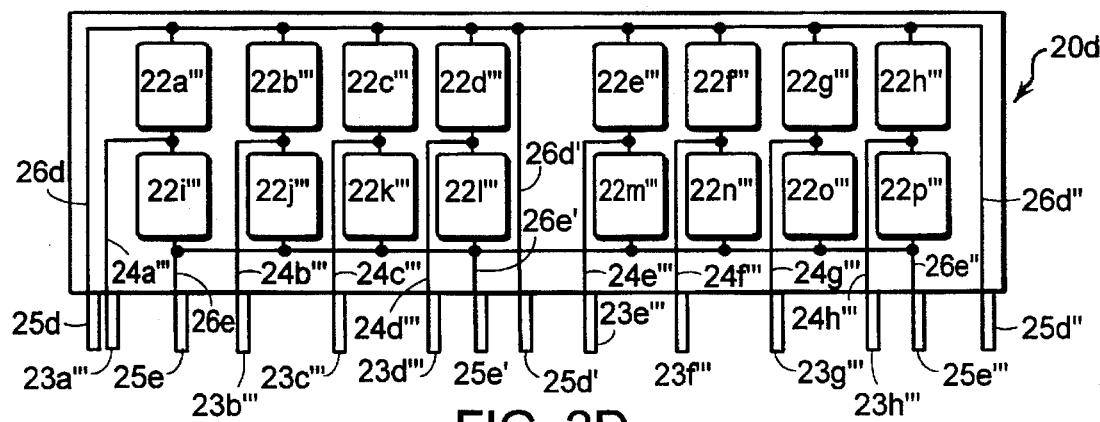
FIG. 2D is a schematic diagram of the present invention triple pull-up/pull-down terminating resistor network.

Referring now to FIG. 2D, a pull-up/pull-down network resistor termination package 20d having three reference conductor pull-up/pull-down connections, is shown to include sixteen thick film terminating resistors (22a"'–22p"') used to terminate eight conductors (24a"'–24h"') of the transmission line. Resistors 22a"'–22h"' have one terminus coupled to pins 23a"'–23h"' via conductors 24a"'–24h"'. The upper resistors 22a"'–22h"' have their upper termini connected to common lead or reference lines 26d, 26d' and 26d" connected to pins 25d, 25d', and 25d" respectively, of the package 20d and used to provide the terminator reference pull-up voltages. The lower resistors 22i"'–22p"' have their lower termini connected to a common lead 26e, 26e', and 26e" which are connected to pins 25e, 25e', and 25e" respectively, of the package 20d and which are used to provide the terminator reference pull-down voltages. This configuration provides for the pull-up and pull-down pins to be physically located next to each other, essentially in parallel, to allow for maximum mutual inductive coupling and hence, minimum total inductance because currents are in opposite directions. Also, since more paths are provided with the three groups of pull-up/pull-down pins in FIG. 2D than there is for all eight together in one group as shown in FIG. 2A., there is less switching current (di) and hence, Ldi/dt is a smaller value.

Figure 3A:
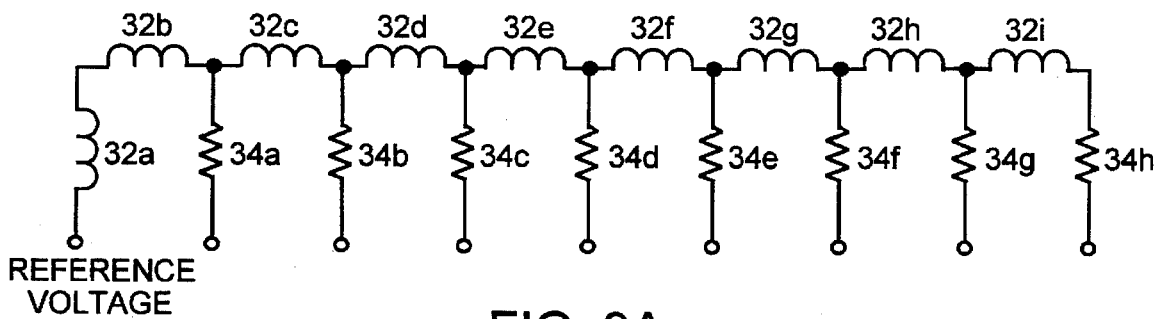
FIG. 3A is a diagram of high frequency equivalent circuits of the single-inline package (SIP) network of single terminating resistors of FIG. 1A.
Figure 3B:
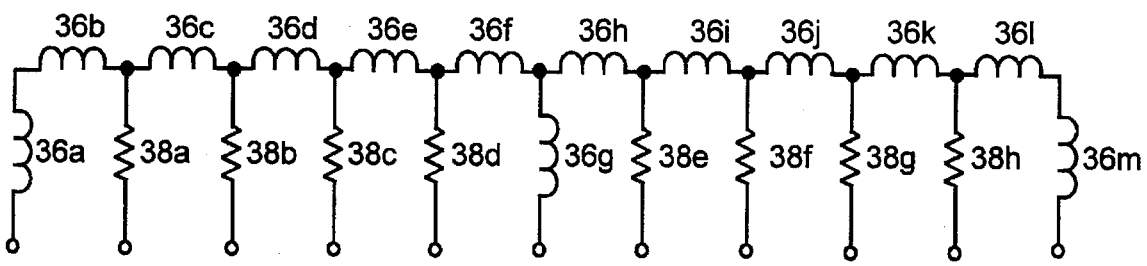
FIG. 3B is a diagram of high frequency equivalent circuits of the single-inline package (SIP) network of triple terminating resistors of the FIG. 1D.

Referring now to FIG. 3A and 3B, the equivalent circuits of the devices of FIG. 1A and 1D, respectively, are shown to include intrinsic inductances 32a–32i provided from the conductor interconnecting the resistors 34a–34h in FIG. 3A and intrinsic inductances 36a–36m provided from the conductor interconnecting the resistors 38a–38h in FIG. 3B. Changing signal currents cause noise voltage across inductances. By providing two reference voltage pins at each end of the SIP and at the center of the SIP, as in FIG. 1D and FIG. 3B, for example, there is an increase in the number of paths and a concomitant reduction in length to each reference voltage pin. This provides a reduction in the effective intrinsic inductance of this type of package in comparison to the prior art package of FIG. 1A.

Figure 4A:
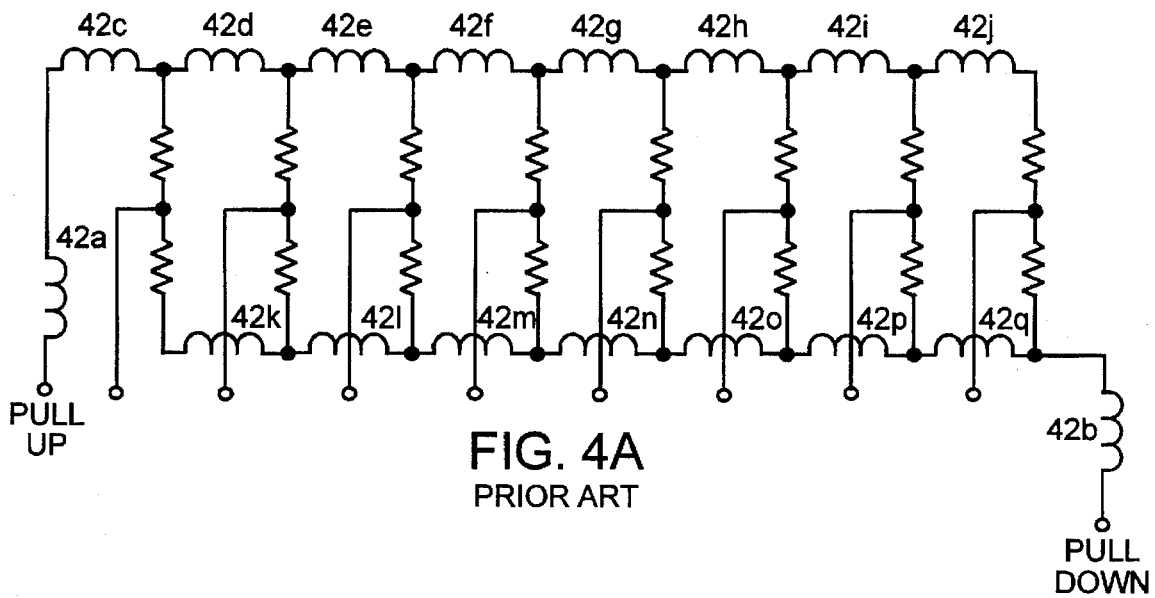
FIG. 4A is a schematic diagram of high frequency equivalent circuits of a single-inline package (SIP) network of pull-up/pull-down terminating resistors.
Figure 4B:
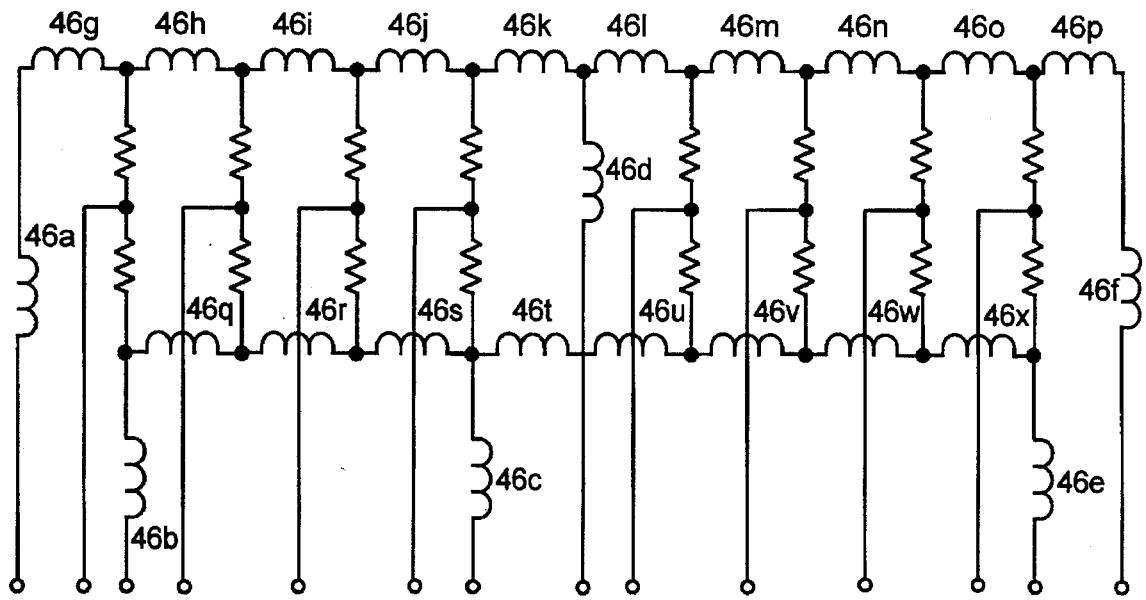
FIG. 4B is a schematic diagram of high frequency equivalent circuits of a single-inline package (SIP) network of pull-up/pull-down triple terminating resistors.

Referring now to FIG. 4A and 4B, the equivalent circuits of the pull-up/pull-down terminating resistor devices of FIG. 2A and 2D are shown to include intrinsic inductances 42a–42q in FIG. 4A and 46a–46x in FIG. 4B provided from the conductor interconnecting the resistors. Changing signal currents cause noise voltage across inductances. Thus, by providing two sets of pull-up/pull-down reference voltage pins at each end of the SIP and one set at the center of the SIP, as in FIG. 2D and FIG. 4B, for example, there is an increase in the number of paths and a reduction in path length to each reference voltage pin, and a concomitant reduction in effective intrinsic inductance of this package in comparison to the prior art package of FIG. 2A.

Figure 5A:
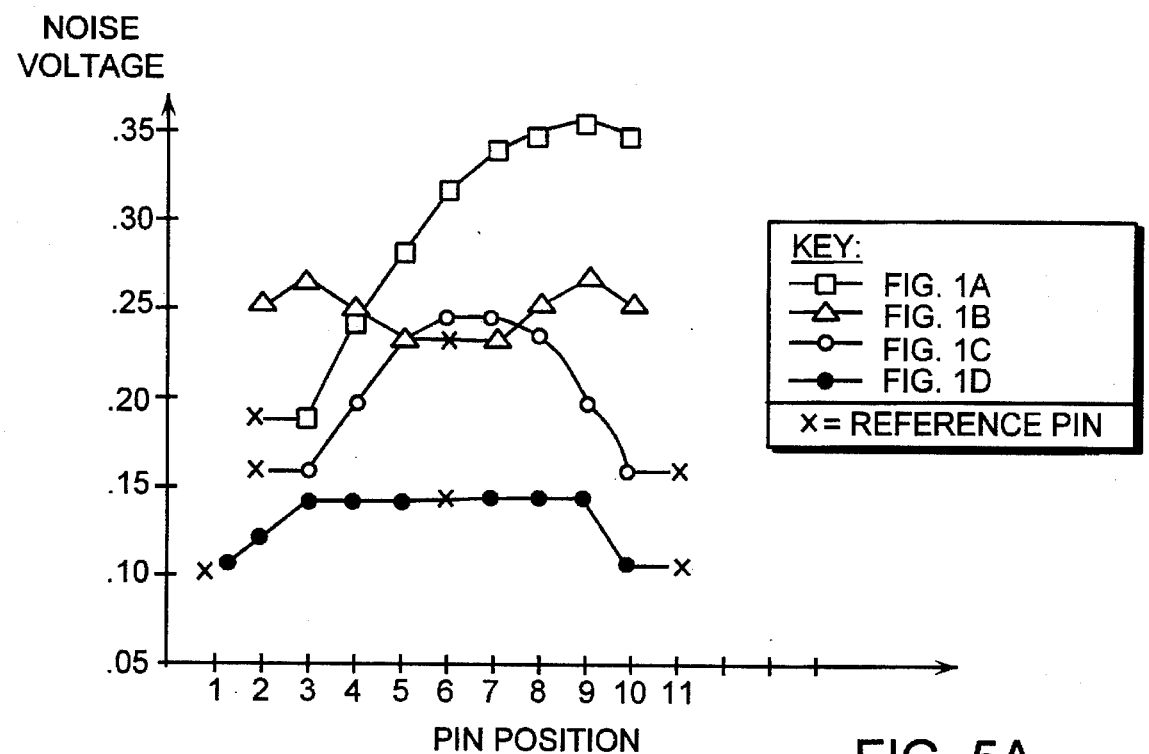
FIG. 5A is a plot of noise voltage levels as a function of pin position in terminations of the types shown in FIGS. 1A–1D.

A simulation of the single terminating resistor devices of FIGS. 1A–1D using SPICE is shown in FIG. 5A. This simulation shows the effect of pin position on the noise voltage. The plot of FIG. 5A shows that there is significantly less noise voltage in FIGS. 1B–1D because of the decrease in switching current (di/dt), than there is in FIG. 1A since the configurations in FIGS. 1B–1D effectively provide inductors in parallel with multiple inductive paths, providing a lower inductance (L), and thereby lowering the L(di/dt) noise voltage. The terminating resistor network of FIG. 1A with a centrally located reference conductor has 23% less noise voltage than the prior art single terminating resistor network of FIG. 1A. The terminating resistor network of FIG. 1B with two reference conductors positioned at the ends of the package has 29% less noise voltage and the terminating resistor network having three reference conductors at the two ends of the package and at the center has 59% less noise voltage than the prior art single terminating resistor network of FIG. 1A.

Figure 5B:
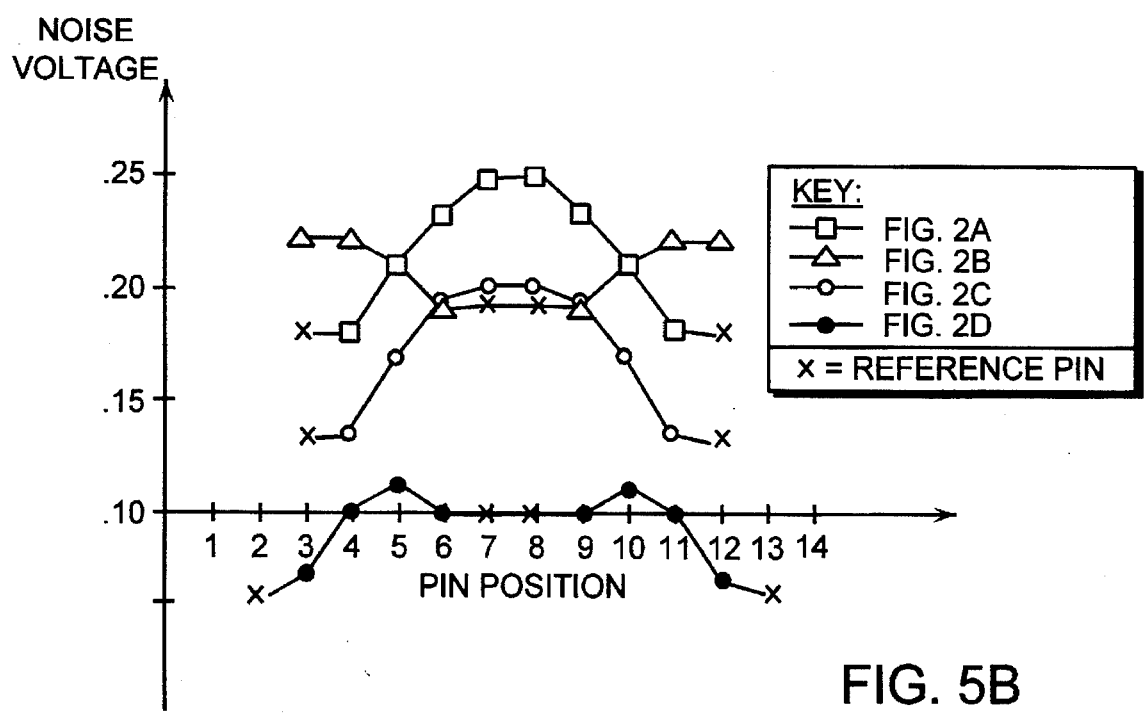
FIG. 5B is a plot of noise voltage levels as a function of pin position in terminations of the types shown in FIGS. 2A–2D.

Similarly, the simulation of the pull-up/pull-down terminating resistor devices of FIGS. 2A–2D using SPICE is shown in FIG. 5B to show the effect of pin position on the noise voltage. The plot of FIG. 5B shows that there would be less noise voltage in FIGS. 2B–2D because of the decrease in switching current (di/dt), than there would be in FIG. 2A since the configurations in FIGS. 2B–2D effectively provide the inductors in parallel with multiple inductive paths, providing a lower inductance (L), and thereby lowering the L(di/dt) noise voltage. The center reference connection pull-up/pull-down terminating resistor network has 10% less noise voltage than the prior art pull-up/pull-down terminating resistor network of FIG. 2A. The double reference conductor connection pull-up/pull-down terminating resistor network has 17% less noise voltage and the triple reference conductor connection pull-up/pull-down terminating resistor network has a significant 55% less noise voltage than the prior art pull-up/pull-down terminating resistor network of FIG. 2A.

The described terminations provide a lower inductance in the common lead of multiple resistor packages by multiple paths for power and power return leads to the resistors used for terminating transmission lines. By providing multiple paths, lower effective inductances are provided. Hence, the noise voltages generated by the changing current passing through an inductor are significantly decreased. This allows the packaged termination resistors to be used at higher frequencies and/or higher current switching values without having the noise increase significantly.

The noise voltage generated on a signal pin by switching activity on other pins depends on a couple of factors. A first factor is the position of the signal being considered, (ie. how much inductance is in the path between the signal and the reference voltage, and how many other signals are driving current into that inductance). A second factor is the values of the equivalent circuit inductances. By taking these two factors into consideration, reassignment of signal and reference positions within a SIP package can be provided to significantly reduce generated noise.

As seen above in FIGS. 1–5, the reassignment of signal and reference positions can be accomplished by one of three preferred configurations. Regarding the single terminating resistor network, one configuration relocates the reference voltage pin from the end of the SIP to the center. A second configuration provides a reference pin at each end of the SIP. A final configuration provides a reference pin at each end and in the center of the SIP. Various other configurations can be provided. Note however, that though reaching the least inductance point, where each resistor has a reference voltage pin associated with it, may lower the inductance significantly, such a design would incur the highest extra pin usage.

Simulated noise voltage levels at each pin as a result of signals on the other pins are plotted as a function of position in the SIP as shown in FIGS. 5A and 5B, for a standard prior art design and for each of the three improved configurations of the present invention above, show substantial reduction in noise in the improved configurations over the standard design. Further, these design improvements are expected to have no impact on the SIP manufacturing process, and will incur system cost only in terms of the extra pins needed for reference voltages. That is, they will be larger by the space needed for each additional reference pin.

Having described preferred embodiments of the invention, it will now become apparent to those of skill in the art that other embodiments incorporating its concepts may be provided. It is felt, therefore, that this invention should not be limited to the disclosed embodiments, but rather should be limited only by the spirit and scope of the appended claims.

What is claimed is:

1. A termination device comprising:

a package having a plurality of pins;

a plurality of resistors disposed in said package each having a pair of termini with a first one of said termini of each resistor connected to a corresponding one of said plurality of pins;

a common conductor connected to a second one of said termini of each resistor; and a reference conductor connected between a mid-portion of said common conductor and another one of said plurality of pins of said package, with said another one of said plurality of pins being connected to said second one of said termini of said plurality of resistors.

2. The termination device of claim 1 further comprising:

a pair of reference conductors, each connected between one of respective end portions of said common conductor and a corresponding end portion one of said plurality of pins of said package, with each of said corresponding end portion ones of said plurality of pins being connected to said second one of said termini of said plurality of resistors.

3. The termination device of claim 2 wherein said plurality of resistors are configured in a pull-up/pull-down resistor network.

4. A termination device comprising:

a package having a plurality of pins;

a plurality of resistors disposed in said package each having a pair of termini with a first one of said termini of each resistor connected to a corresponding one of said plurality of pins;

a common conductor connected to a second one of said termini of each resistor; and a plurality of reference conductors having a first terminus on said common conductor, a first one of said plurality of reference conductors having said first terminus at a mid-portion of said common conductor, a second one of said plurality of reference conductors having said first terminus at an end portion of said common conductor, a third one of said plurality of reference conductors having said first terminus at another end portion of said common conductor, and each of said plurality of reference conductors having a second terminus at one of said plurality of pins.

5. The termination device of claim 4 wherein said plurality of resistors are configured in a pull-up/pull-down resistor network.

6. A termination device comprising:

a package having a plurality of pins;

a plurality of resistors disposed in said package each having a pair of termini with a first one of said termini of each resistor connected to a corresponding one of said plurality of pins;

a common conductor connected to a second one of said termini of each resistor; and a pair of reference conductors, each having a first terminus at an end portion of said common conductor and a second terminus at one of said plurality of pins.

7. The termination device of claim 6 wherein said plurality of resistors are configured in a pull-up/pull-down resistor network.

* * * * *